(12) United States Patent
Liu et al.

(10) Patent No.: US 12,002,728 B2
(45) Date of Patent: Jun. 4, 2024

(54) INTEGRATED RADIATOR HAVING TEMPERATURE GRADIENT

(71) Applicant: QKM TECHNOLOGY (DONG GUAN) CO., LTD, Guangdong (CN)

(72) Inventors: Jiang Liu, Guangdong (CN); Chi Sha, Fremont, CA (US); Lihui Chen, Guangdong (CN); Rongkui Zheng, Guangdong (CN); Hui Du, Guangdong (CN); Yu Lei, Guangdong (CN); Bin Wang, Guangdong (CN)

(73) Assignee: QKM TECHNOLOGY (DONG GUAN) CO., LTD, Guangdong (CN)

( * ) Notice: Subject to any disclaimer, the term of this patent is extended or adjusted under 35 U.S.C. 154(b) by 725 days.

(21) Appl. No.: 17/254,010

(22) PCT Filed: Jun. 20, 2019

(86) PCT No.: PCT/CN2019/092125
§ 371 (c)(1),
(2) Date: Dec. 18, 2020

(87) PCT Pub. No.: WO2019/242697
PCT Pub. Date: Dec. 26, 2019

(65) Prior Publication Data
US 2021/0272871 A1    Sep. 2, 2021

(30) Foreign Application Priority Data

Jun. 20, 2018  (CN) .......................... 201810639815.2
Jun. 20, 2018  (CN) .......................... 201820959130.1

(51) Int. Cl.
*H05K 7/20*     (2006.01)
*H01L 23/367*   (2006.01)
*H01L 23/467*   (2006.01)

(52) U.S. Cl.
CPC ........ *H01L 23/3672* (2013.01); *H01L 23/467* (2013.01); *H05K 7/2039* (2013.01)

(58) Field of Classification Search
None
See application file for complete search history.

(56) References Cited

U.S. PATENT DOCUMENTS 5,168,348 A  * 12/1992  Chu ..................... H01L 23/4338
                                                        257/713
10,004,160 B1 *  6/2018  Gong ................. H05K 7/20272
(Continued)

FOREIGN PATENT DOCUMENTS

CN     101150101 A     3/2008
CN     201051761 Y     4/2008
(Continued)

OTHER PUBLICATIONS

"Notice of Reasons for Refusal," Japanese Patent Application No. 2020-569184, Japanese Patent Office (dated Dec. 27, 2021).
(Continued)

*Primary Examiner* — Courtney L Smith
(74) *Attorney, Agent, or Firm* — TechLaw Ventures, PLLC; Terrence J. Edwards

(57) ABSTRACT

An integrated radiator having a temperature gradient is disposed between a high-temperature device and a low-temperature device. The integrated radiator includes a first heat dissipation unit and a second heat dissipation unit which are integrally fixed. The first heat dissipation unit is configured to maintain the high-temperature device within a first temperature range, and the second heat dissipation unit is configured to maintain the low-temperature device within a second temperature range. A thermal conductive path of the first heat dissipation unit is isolated from a thermal conductive path of the second heat dissipation unit, and the
(Continued)

first heat dissipation unit is physically connected to but thermally separated from the second heat dissipation unit.

20 Claims, 4 Drawing Sheets

(56) References Cited

U.S. PATENT DOCUMENTS

| | | | | |
|---|---|---|---|---|
| 10,147,666 B1* | 12/2018 | Trimberger | ............ | H01L 23/544 |
| 10,383,260 B2* | 8/2019 | Audemar | ............. | H05K 1/0203 |
| 10,446,488 B1* | 10/2019 | Sherrima | ............. | H05K 3/4038 |
| 2006/0102319 A1 | 5/2006 | Liu | | |
| 2006/0181854 A1 | 8/2006 | Freedman | | |
| 2011/0012255 A1* | 1/2011 | Suganuma | ............ | H01L 23/467 |
| | | | | 257/E23.08 |
| 2011/0100406 A1 | 5/2011 | Danenberg | | |
| 2012/0300406 A1* | 11/2012 | Fukui | .................... | H01L 23/367 |
| | | | | 165/185 |
| 2015/0257249 A1 | 9/2015 | Kim | | |

FOREIGN PATENT DOCUMENTS

| | | |
|---|---|---|
| CN | 201846538 U | 5/2011 |
| CN | 202068319 U | 12/2011 |
| CN | 203105001 U | 7/2013 |
| CN | 206237317 U | 6/2017 |
| CN | 108630640 A | 10/2018 |
| CN | 208208744 U | 12/2018 |
| JP | 2001168560 A | 6/2001 |
| JP | 2001355937 A | 12/2001 |
| JP | 2008198928 A | 8/2008 |
| JP | 2010129593 A | 6/2010 |
| TW | 1614857 B | 2/2018 |
| WO | 2018045933 A1 | 3/2018 |

OTHER PUBLICATIONS

English Translation of "Notice of Reasons for Refusal," Japanese Patent Application No. 2020-569184, Japanese Patent Office (dated Dec. 27, 2021).

English Translation of JP2010129593A prepared by Google Patents (https://patents.google.com/patent/JP2010129593A/en?oq= JP2010129593).

European Patent Office "European Search Report and Written Opinion Received for European Application No. 19823723.2 / PCT Application No. PCT/US2017051026," dated Feb. 21, 2022, 11 Pages.

CNIPA, "International Search Report," dated Jul. 18, 2019, International Application No. PCT/CN2019/092125.

English translation of CN101150101 prepared by Google Patents on Sep. 26, 2023 (https://patents.google.com/patent/CN101150101A/ en?oq=CN101150101).

English translation of CN206237317 prepared by Google Patents on Sep. 26, 2023 (https://patents.google.com/patent/CN206237317U/ en?oq=CN206237317).

English translation of CN208208744 prepared by Google Patents on Sep. 26, 2023 (https://patents.google.com/patent/CN208208744U/ en?oq=CN208208744).

English translation of JP2001168560 prepared by Google Patents on Sep. 26, 2023 (https://patents.google.com/patent/JP2001168560A/ en?oq=JP2001168560).

English translation of JP2001355937 prepared by Google Patents on Sep. 26, 2023 (https://patents.google.com/patent/JP2001355937A/ en?oq=JP2001355937).

English translation of JP2008198928 prepared by Google Patents on Sep. 26, 2023 (https://patents.google.com/patent/JP2008198928A/ en?oq=JP2008198928).

English translation of JP2010129593 prepared by Google Patents on Sep. 26, 2023 (https://patents.google.com/patent/JP2010129593A/ en?oq=JP2010129593).

* cited by examiner

INTEGRATED RADIATOR HAVING TEMPERATURE GRADIENT

CROSS-REFERENCE TO RELATED APPLICATION

This is a national stage application filed under 37 U.S.C. 371 based on International Patent Application No. PCT/CN2019/092125 filed on Jun. 20, 2019, which is based on and claims priority of Chinese patent application CN201810639815.2 filed on Jun. 20, 2018 to the CNIPA and entitled INTEGRATED RADIATOR HAVING A TEMPERATURE GRADIENT, and priority of Chinese patent application CN201820959130.1 filed on Jun. 20, 2018 to the CNIPA and entitled INTEGRATED RADIATOR HAVING A TEMPERATURE GRADIENT, which are incorporated in the present application by reference in their entireties.

TECHNICAL FIELD

The present application belongs to the technical field of heat dissipation, and in particular, to an integrated radiator having a temperature gradient.

BACKGROUND

With the continuous development of a robot technology, a robot with increasingly powerful functions can satisfy various complex application requirements. The following problem is that the robot has an increasingly complex internal structure and is equipped with more and more heating components. The rapid increasing heating value causes an ambient temperature in the robot to remain high, seriously affecting normal operation of the robot.

A driver is one of portions where heat is most concentrated. The driver is configured to implement servo driving and control on the robot and be internally equipped with a large number of electronic and electrical devices, which generate a great amount of heat but are very sensitive to the working temperature environment.

Generally, the electronic and electrical device serving as a heat source includes a logic device and a power device. The logic device is configured to implement logic operation and control, has a relatively lower working temperature range, and belongs to a low-temperature device that cannot withstand a high temperature. The power device includes an IGBT, an MOSFET and other types of devices, has a relatively higher working temperature range, and belongs to a high-temperature device that can withstand the high temperature. Since ambient temperatures of the low-temperature device and the high-temperature device vary greatly, the low-temperature device and the high-temperature device generally need to separately dissipate heat in the existing art, and the assembly of radiators is very complicated due to the large number of radiator. Moreover, space environment and position distribution of the radiators are seriously restricted, thereby causing a lower heat dissipation effect.

SUMMARY

In order to overcome shortcomings of the existing art, an integrated radiator having a temperature gradient provided by the present application achieves gradient regional heat dissipation with an integrated structure, and meanwhile satisfies a requirement for heat dissipation of a low-temperature device and a high-temperature device, thereby saving assembling procedures and facilitating an arrangement design of the devices.

An object of the present application is implemented through solutions described below.

An integrated radiator having a temperature gradient is disposed between a high-temperature device and a low-temperature device. The integrated radiator includes a first heat dissipation unit and a second heat dissipation unit which are integrally fixed. The first heat dissipation unit is configured to maintain the high-temperature device within a first temperature range, and the second heat dissipation unit is configured to maintain the low-temperature device within a second temperature range. A thermal conductive path of the first heat dissipation unit is isolated from a thermal conductive path of the second heat dissipation unit, and the first heat dissipation unit is physically connected to but thermally separated from the second heat dissipation unit.

As an improvement of the above-mentioned solution, the first heat dissipation unit includes a heat dissipation base and a second heat dissipation plate which are integrally connected, a side surface of the second heat dissipation plate facing away from the low-temperature device is kept in contact with the high-temperature device, and a temperature gradient of the first heat dissipation unit points to the second heat dissipation plate from the heat dissipation base.

As a further improvement of the above-mentioned solution, the second heat dissipation plate is kept separated from the second heat dissipation unit, and the heat dissipation base is disposed at a side of the second heat dissipation plate facing away from the second heat dissipation unit.

As a further improvement of the above-mentioned solution, an insulating air gap is provided between the second heat dissipation plate and the second heat dissipation unit.

As a further improvement of the above-mentioned solution, a connection portion is provided between the first heat dissipation unit and the second heat dissipation unit, and the connection portion is thermally separated from the second heat dissipation plate.

As a further improvement of the above-mentioned solution, the second heat dissipation unit includes a first heat dissipation plate, a side surface of the first heat dissipation plate facing away from the high-temperature device is kept in contact with the low-temperature device, and a side surface of the first heat dissipation plate facing towards the high-temperature device is provided with an auxiliary heat dissipation channel, and the auxiliary heat dissipation channel is thermally separated from the first heat dissipation unit.

As a further improvement of the above-mentioned solution, the auxiliary heat dissipation channel includes a plurality of heat dissipation fins, the plurality of heat dissipation fins are disposed on the side surface of the first heat dissipation plate facing towards the high-temperature device, a heat dissipation flow channel is formed between adjacent ones of the plurality of heat dissipation fins, and a flow direction of cooling fluid in the heat dissipation flow channel is perpendicular to a temperature gradient of the first heat dissipation unit.

As a further improvement of the above-mentioned solution, a plurality of heat dissipation flow channels are parallel to each other, and one end of the auxiliary heat dissipation channel is provided with a heat dissipation fan.

As a further improvement of the above-mentioned solution, a height of each of the plurality of heat dissipation fins is positively correlated with heat value of the low-temperature device acted by the plurality of heat dissipation fins.

As a further improvement of the above-mentioned solution, an insulating air gap is provided between the auxiliary heat dissipation channel and the first heat dissipation unit.

The present application has the beneficial effects described below.

Through the integrated radiator composed of the first heat dissipation unit and the second heat dissipation unit, the high-temperature device is physically separated from the low-temperature device. The first heat dissipation unit radiates heat to the high-temperature device, the second heat dissipation unit radiates heat to the low temperature device, and thermal separation is maintained between the first heat dissipation unit and the second heat dissipation unit, such that thermal separation between the high-temperature device and the low-temperature device is achieved. Gradient heat dissipation in different sections is implemented with a same radiator structure, and heat dissipation requirements of the low-temperature device and the high-temperature device are simultaneously satisfied. Assembly procedures are saved in a one-time assembly mode, and an arrangement design of devices is facilitated.

In order to make the above objects, features and advantages of the present application more apparent, the preferred embodiments will be described in detail below in conjunction with the accompanying drawings.

BRIEF DESCRIPTION OF DRAWINGS

To illustrate solutions in embodiments of the present application more clearly, the accompanying drawings used in the embodiments will be briefly described below. It is to be understood that the subsequent drawings illustrate only certain embodiments of the present application, and therefore should not be construed as limiting the scope. Those of ordinary skill in the art may obtain other related drawings based on the accompanying drawings described below on the premise that no creative work is done.

REFERENCE LIST

Figure 1:
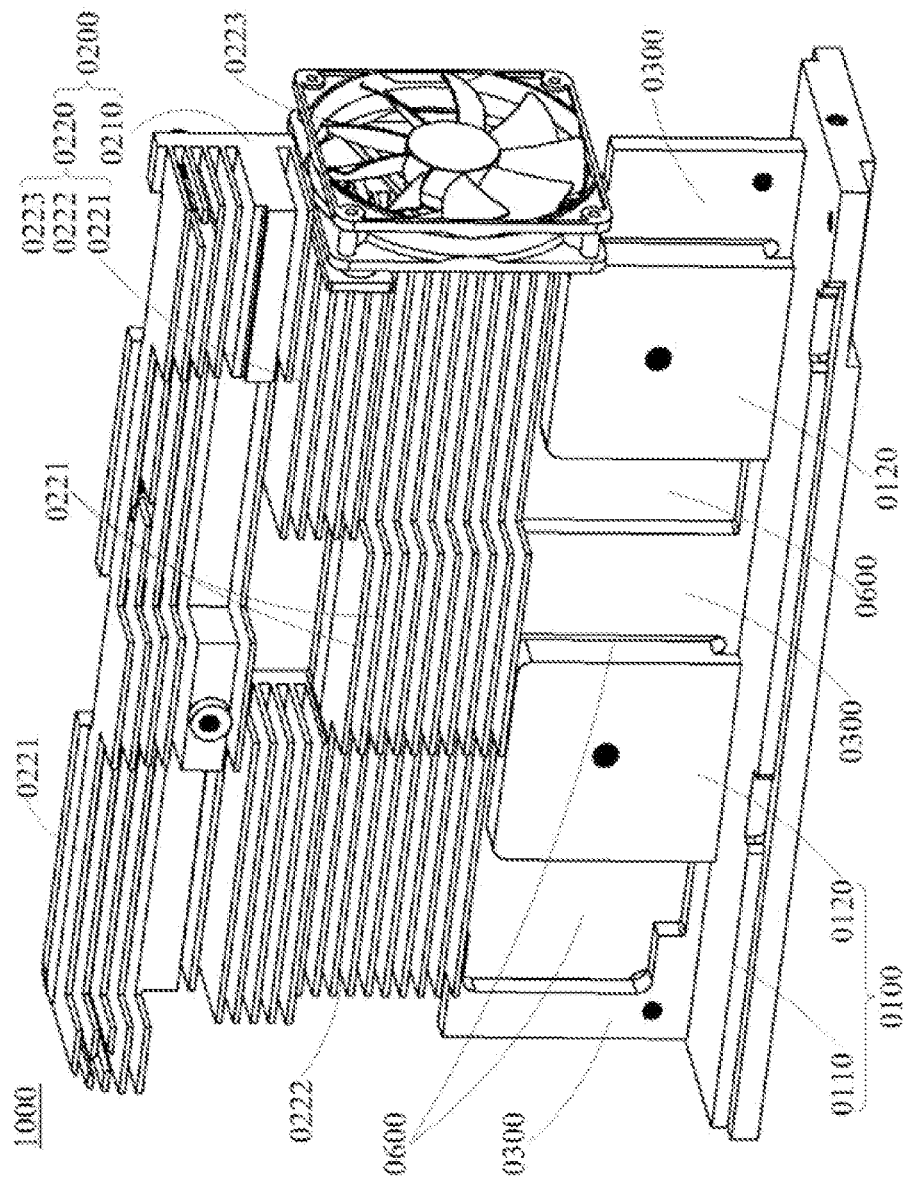
FIG. 1 is a front axonometric view of an integrated radiator having a temperature gradient according to embodiment one of the present application.

1000 integrated radiator having a temperature gradient
0100 first heat dissipation unit
0110 heat dissipation base
0120 first heat dissipation fin second heat dissipation plate
0200 second heat dissipation unit
0210 first heat dissipation plate
0211 heat dissipation boss
0212 guide opening
0220 auxiliary heat dissipation channel
0221 heat dissipation fin
0222 heat dissipation flow channel
0223 heat dissipation fan
0300 connection portion
0400 first insulating air gap
0500 second insulating air gap
0600 third insulating air gap
2000 high-temperature device
3000 low-temperature device

DETAILED DESCRIPTION

In order to facilitate the understanding of the present application, a more comprehensive description of an integrated radiator having a temperature gradient will be given below with reference to the related drawings. Preferred embodiments of the integrated radiator having the temperature gradient are shown in the drawings. However, the integrated radiator having the temperature gradient may be implemented in many different forms and is not limited to the embodiments described herein. Conversely, these embodiments are provided to make the disclosure of the integrated radiator having the temperature gradient more thorough and comprehensive.

It is to be noted that when a component is described as being "fixed to" another component, it may be directly on the particular component or intervening components may be on the particular component. When a component is described as being "connected to" another component, it may be directly connected to the particular component or intervening components may be connected to the particular component. Conversely, when a component is described as being "directly on" another component, there is no intervening component. The terms "vertical", "horizontal", "left", "right" and the like used herein are only used for an illustrative purpose.

Unless otherwise defined, all technical and scientific terms used herein have the same meanings as the terms commonly understood by those skilled in the art. Terms used in the description of the integrated radiator having the temperature gradient in the present application are only used to describe specific embodiments and not intended to limit the present application. The term "and/or" used herein includes any or all combinations of one or more listed associated items.

Embodiment One

Figure 2:
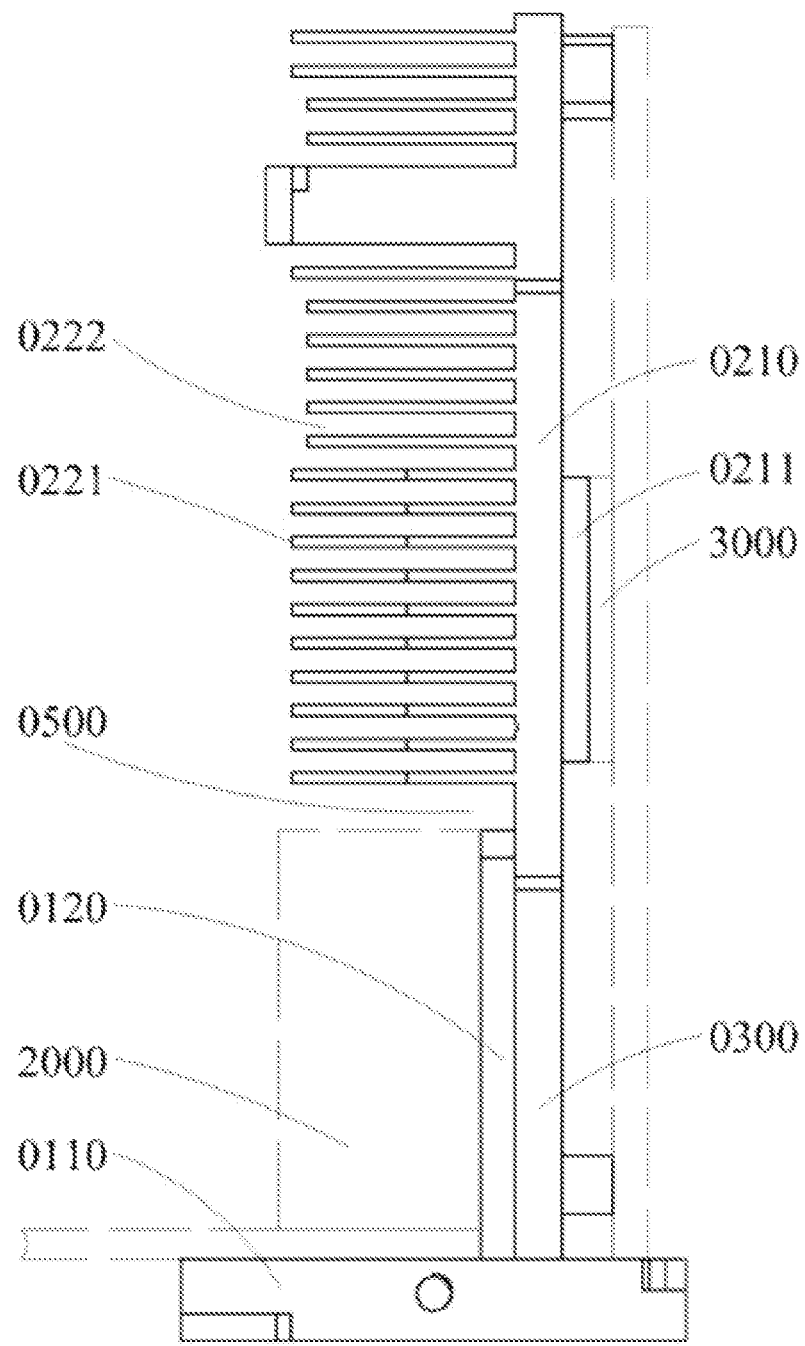
FIG. 2 is a schematic diagram of an application of an integrated radiator having a temperature gradient according to embodiment one of the present application.

Referring to FIG. 1 to FIG. 2, this embodiment provides an integrated radiator 1000 (hereinafter referred to as "integrated radiator") having a temperature gradient disposed between a high-temperature device 2000 and a low-temperature device 3000, and partition heat dissipation on an integrated structure is implemented in a thermal isolation mode, thus forming different temperature sections with a constant temperature difference and a stable temperature gradient, and satisfying heat dissipation requirements of the high-temperature device 2000 and the low-temperature device 3000.

The integrated radiator 1000 includes a first heat dissipation unit 0100 and a second heat dissipation unit 0200 which are integrally fixed, and the first heat dissipation unit 0100 is physically connected to but thermally separated from the second heat dissipation unit 0200. In other words, the first heat dissipation unit 0100 and the second heat dissipation unit 0200 are physically integrated to implement one-time installation without the need for a plurality of radiators; and the first heat dissipation unit 0100 is thermally separated from the second heat dissipation unit 0200 such that heat exchange between the first heat dissipation unit 0100 and the second heat dissipation unit 0200 is basically not generated, thereby ensuring that the temperature environment of the first heat dissipation unit 0100 and the temperature environment of the second heat dissipation unit 0200 are stable and avoiding thermal damage of the low-temperature device 3000 caused by heat exchange.

The first heat dissipation unit 0100 is configured to maintain the high-temperature device 2000 within a first temperature range and only apply heat absorption and heat dissipation functions to the high-temperature device 2000; and the second heat dissipation unit 0200 is configured to maintain the low-temperature device 3000 within a second temperature range and only apply the heat absorption and heat dissipation functions to the low-temperature device 3000.

The first temperature range is an operating temperature range of the high-temperature device 2000 and belongs to inherent properties of the high-temperature device 2000, the second temperature range is an operating temperature range of the low-temperature device 3000 and belong to inherent properties of the low-temperature device 3000. Generally, the first temperature range and the second temperature range can be acquired from the specification of the high-temperature device 2000 and the low-temperature device 3000.

A thermal conductive path of the first heat dissipation unit 0100 and a thermal conductive path of the second heat dissipation unit 0200 are isolated from each other, and each remain independent and complete. That is, heat loss of the first heat dissipation unit 0100 and heat loss of the second heat dissipation unit 0200 are independent of each other, and no heat exchange occurs between the first heat dissipation unit 0100 and the second heat dissipation unit 0200. In other words, a temperature gradient of the first heat dissipation unit 0100 and a temperature gradient of the second heat dissipation unit 0200 have different directions without interfering with each other.

The cooling function of the first heat dissipation unit 0100 may be implemented in many modes including metal conduction, fluid cooling and the like. Exemplarily, the first heat dissipation unit 0100 includes a heat dissipation base 0110 and a second heat dissipation plate 0120 which are integrally connected, and a side surface of the second heat dissipation plate 0120 facing away from the low-temperature device 3000 is kept in contact with the high-temperature device 2000 so as to ensure a better heat dissipation effect.

Exemplarily, the second heat dissipation plate 0120 is a metal sheet, such as a copper sheet, an aluminum sheet or the like. Additionally, the second heat dissipation plate 0120 is configured to absorb heat from the high-temperature device 2000. It is to be understood that the second heat dissipation plate 0120 is provided with a heat source device only on one side, and the other side is obliquely opposite to the low-temperature device 3000, such that a one-side centralized heat dissipation structure is formed and a better thermal isolation effect is ensured.

The temperature gradient of the first heat dissipation unit 0100 points to the second heat dissipation plate 0120 from the heat dissipation base 0110, such that the heat of the first heat dissipation unit 0100 directionally flows to the heat dissipation base 0110 from the second heat dissipation plate 0120. Consequently, the heat dissipation base 0110 is connected to a heat dissipation device so as to achieve the final heat dissipation of the high-temperature device 2000.

Figure 3:
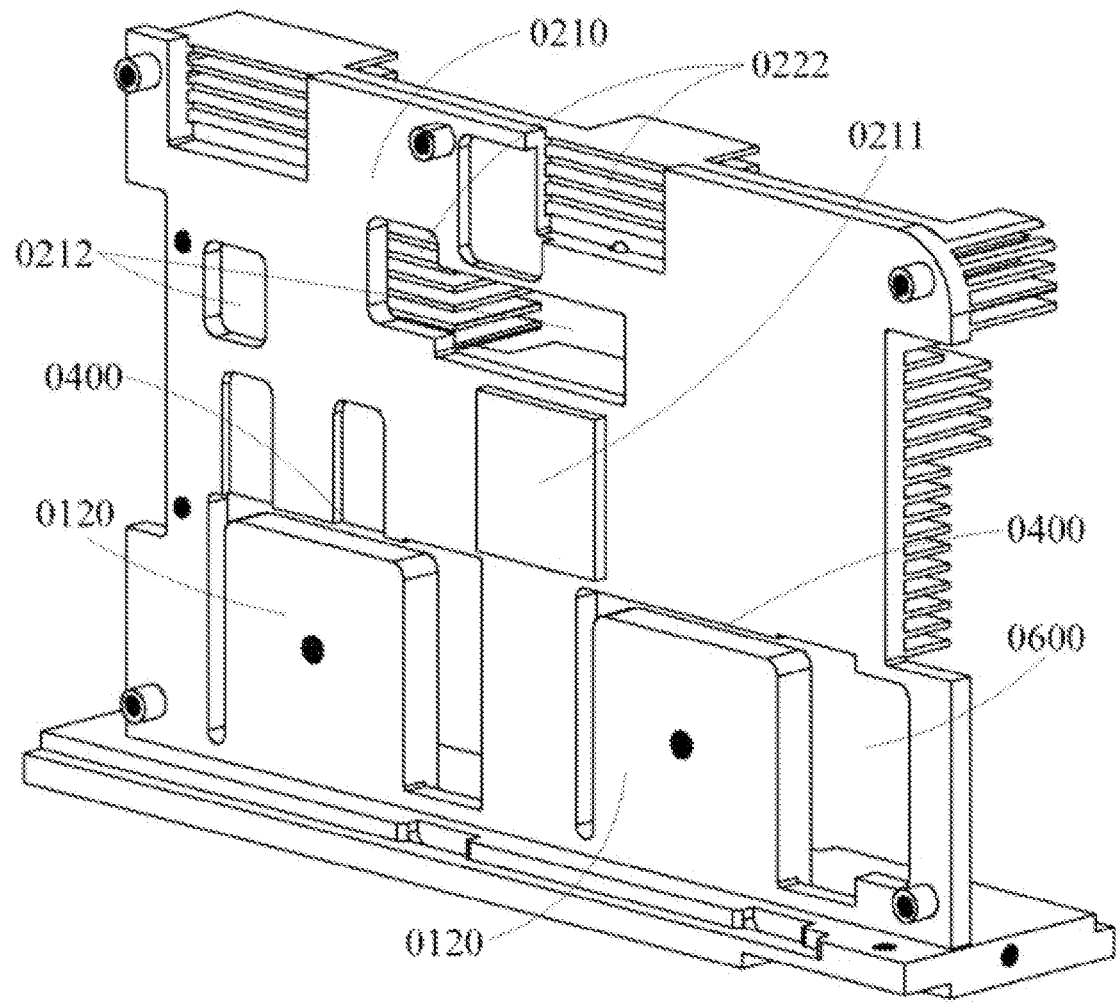
FIG. 3 is a rear axonometric view of an integrated radiator having a temperature gradient according to embodiment one of the present application.
Figure 4:
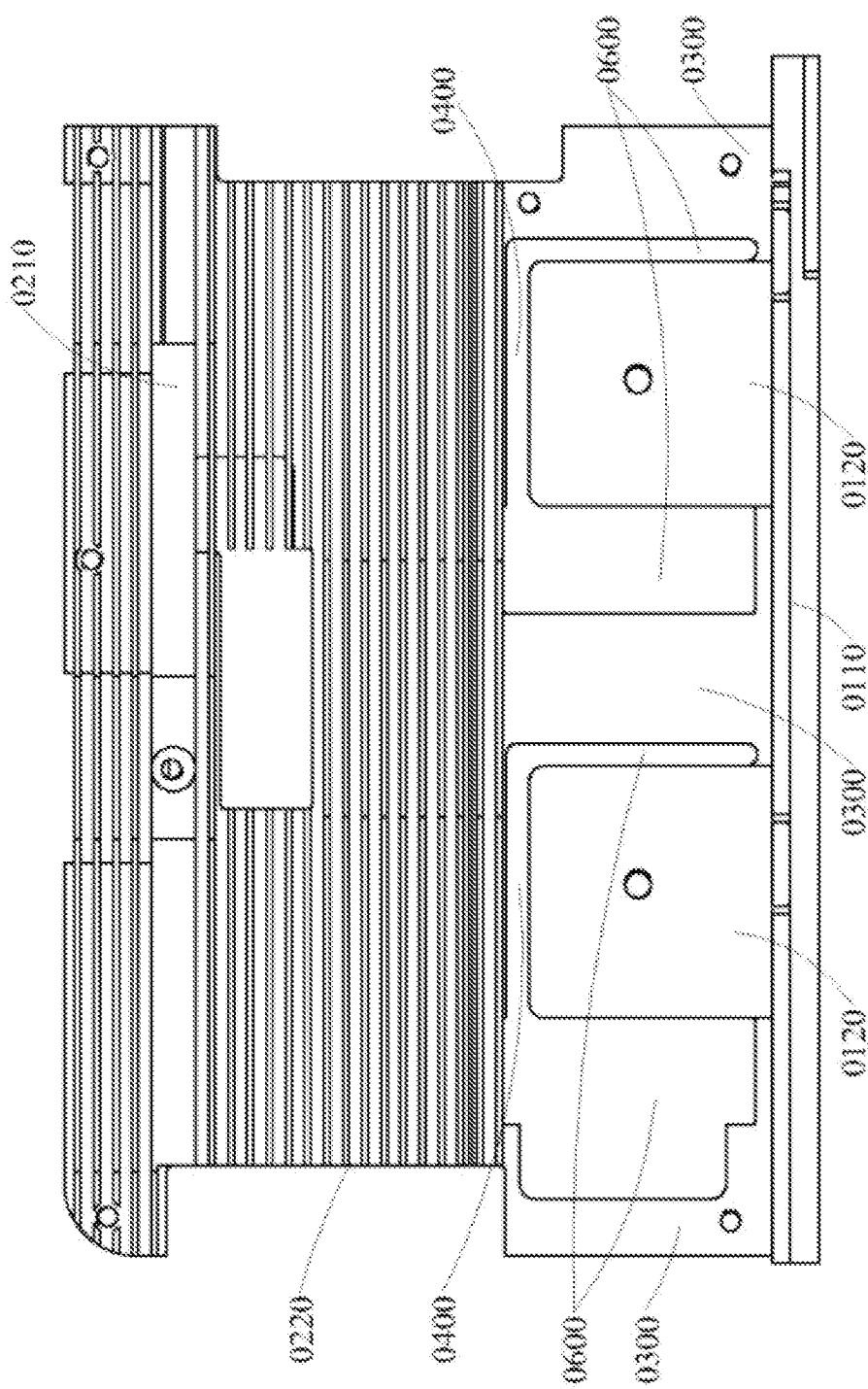
FIG. 4 is a front view of an integrated radiator having a temperature gradient according to embodiment one of the present application.

Referring to FIG. 3 to FIG. 4, exemplarily, the second heat dissipation plate 0120 is kept separated from the second heat dissipation unit 0200, and the heat dissipation base 0110 is disposed on a side of the second heat dissipation plate 0120 facing away from the second heat dissipation unit 0200. For example, the heat dissipation base 0110 is configured to implement external mounting, the second heat dissipation plate 0120 and the second heat dissipation unit 0200 are kept opposite and not connected to each other, and a first insulating air gap 0400 is provided between the second heat dissipation plate 0120 and the second heat dissipation unit 0200. The function of the first insulating air gap 0400 is at least to isolate the thermal conduction between the second heat dissipation plate 0120 and the first heat dissipation plate 0210. Exemplarily, the composition of the first isolating air gap may be air. Specific heat capacity of the air is far greater than specific heat capacity of the second heat dissipation plate 0120 (metal), and heat absorption effect of the air is far less than heat absorption effect of the second heat dissipation plate 0120, so thermal conduction effect of the air is not significant and the temperature of the air is basically kept unchanged, thus effectively separating the thermal conduction.

The cooling function of the second heat dissipation unit 0200 may be implemented in many modes including metal conduction, fluid cooling and the like. Exemplarily, the second heat dissipation unit 0200 includes a first heat dissipation plate 0210, and a side surface of the first heat dissipation plate 0210 facing away from the high-temperature device 2000 is kept in contact with the low-temperature device 3000, thus ensuring a better heat dissipation effect. It is to be understood that the first heat dissipation plate 0210 is provided with a heat source device only on one side, and the other side is obliquely opposite to the high-temperature device 2000, such that a one-side centralized heat dissipation structure is formed and a better thermal isolation effect is ensured.

Exemplarily, the first heat dissipation plate 0210 is a metal sheet such as a copper sheet, an aluminum sheet or the like. Additionally, the first heat dissipation plate 0210 is configured to absorb heat from the low-temperature device 3000. Exemplarily, a side surface of the first heat dissipation plate 0210 facing towards the low-temperature device 3000 is provided with a heat dissipation projection 0211, and the heat dissipation projection 0211 is arranged to adhere to the low-temperature device 3000, so as to further enhance the adaptability of the first heat dissipation plate 0210 to a surface undulation of a circuit board and enhance the heat dissipation effect. Exemplarily, the first heat dissipation plate 0210 further has guide openings 0212 penetrating through a front wall surface and a rear wall surface thereof, thereby further enhancing the heat exchange effect and increasing the heat dissipation effect.

A side surface of the first heat dissipation plate 0210 facing towards the high-temperature device 2000 is provided with an auxiliary heat dissipation channel 0220, such that the heat dissipation effect is further enhanced so as to satisfy requirement of the second temperature range. The auxiliary heat dissipation channel 0220 is thermally isolated from the first heat dissipation unit 0100, ensuring that no heat exchange occurs between the auxiliary heat dissipation channel 0220 and the first heat dissipation unit 0100. A main form of the auxiliary heat dissipation channel 0220 is that heat dissipation and cooling are implemented by a cooling function of fluid. Exemplarily, the guide openings 0212 are connected to the auxiliary heat dissipation channel 0220 such that the auxiliary heat dissipation channel 0220 faces the low-temperature device 3000, enhancing the heat dissipation effect of the auxiliary heat dissipation channel 0220.

Exemplarily, the auxiliary heat dissipation channel 0220 and the first heat dissipation unit 0100 (such as the second heat dissipation plate 0120) are kept opposite but not connected to each other, and a second insulating air gap 0500 is provided between the auxiliary heat dissipation channel 0220 and the first heat dissipation unit 0100. The function of the second insulating air gap 0500 is at least to isolate thermal conduction between the auxiliary heat dissipation channel 0220 and the first heat dissipation unit 0100 (such as the second heat dissipation plate 0120). Exemplarily, the composition of the second isolating air gap may be air.

Exemplarily, the auxiliary heat dissipation channel 0220 is implemented in the form of air cooling. The auxiliary heat dissipation channel 0220 includes a plurality of heat dissipation fins 0221, and the plurality of heat dissipation fins 0221 is disposed on the side surface of the first heat dissipation plate 0210 facing towards the high-temperature device 2000. A heat dissipation flow channel 0222 is formed between adjacent heat dissipation fins 0221, and a flow direction of cooling fluid in the heat dissipation flow channel 0222 is perpendicular to a temperature gradient of the first heat dissipation unit 0100, so as to ensure that the cooling fluid does not come into thermal contact with the first heat dissipation unit 0100, thereby avoiding thermal damage. Exemplarily, the heat dissipation flow channel 0222 forms a flow channel structure surrounded on three sides and opened on one side.

Exemplarily, a plurality of heat dissipation flow channels 0222 are parallel to each other, and one end of the auxiliary heat dissipation channel 0220 is provided with a heat dissipation fan 0223. Under the action of the heat dissipation fan 0223, cooling air of the directional fluid is formed in the heat dissipation flow channel 0222; and the cooling air is kept inside the heat dissipation flow channel 0222 all the time and no lateral dissipation occurs, thereby effectively isolating the heat exchange between the auxiliary heat dissipation channel 0220 and the first heat dissipation unit 0100. Exemplarily, the heat dissipation fan 0223 has an adjustable rotation speed such that accurate control on the temperature is implemented by adjusting speed, and the heat dissipation fan adapts to different application environments.

Exemplarily, a height of each heat dissipation fins 0221 is positively correlated with heat value of the low-temperature device 3000 acted upon the plurality of heat dissipation fins. Specifically, the height of the heat dissipation fin 0221 is relatively higher in regions with relatively larger heat value (for example, at the CPU) so as to increase an action area and enhance the heat dissipation effect; and the height of the heat dissipation fin 0221 is relatively smaller in regions with relatively smaller heat value (such as an empty region of components such as capacitors or PCB) so as to save materials. More importantly, heat dissipation fins 0221 with different heights form different heat dissipation effects, further increasing the temperature difference and forming a temperature gradient effect.

In the above-mentioned structure, along an extension direction of the heat dissipation flow channel 0222, the heat dissipation flow channel 0222 presents an undulating shape, and has different heat dissipation action areas at different action parts. For example, the heat dissipation flow channel 0222 has an inverted T-shaped structure, a bottom edge of the inverted T-shaped structure is kept connected to the first heat dissipation plate 0210, and an extension direction of the bottom edge of the inverted T-shaped structure is consistent with a flow direction of the cooling fluid of the heat dissipation flow channel 0222.

As described above, a thermal conduction path (or the temperature gradient) of the first heat dissipation unit 0100 remains stable, that is, heat flows from the second heat dissipation plate 0120 to the heat dissipation base 0110; and a thermal conduction path (or the temperature gradient) of the second heat dissipation unit 0200 also remains stable, that is, the heat flows along the extension direction of the heat dissipation flow channel 0222. Under the above-mentioned structure, the thermal conduction path of the first heat dissipation unit 0100 and the thermal conduction path of the second heat dissipation unit 0200 do not intersect or coincide, such that there is no heat flow intersection between the first heat dissipation unit 0100 and the second heat dissipation unit 0200, independent and stable temperature gradient regions are respectively formed inside the first heat dissipation unit 0100 and the second heat dissipation unit 0200, and the temperature difference between two temperature gradient regions is kept basically constant, that is, temperatures of the two temperature gradient regions are respectively stable in the first temperature range and the second temperature range, ensuring a gradient partition heat dissipation structure.

Exemplarily, a thickness of the second heat dissipation plate 0120 is greater than a thickness of the first heat dissipation plate 0210, thereby enhancing the thermal isolating effect on the high-temperature device 2000. Specifically, the heat value of the high-temperature device 2000 is relatively larger, and the temperature of the second heat dissipation plate 0120 is prevented from rising too fast with a relatively larger thickness of the second heat dissipation plate 0120, such that the temperature on an opposite side of the second heat dissipation plate 0120 is not too high, and thermal damage to the low-temperature device 3000 is prevented.

Exemplarily, a connection portion 0300 is provided between the first heat dissipation unit 0100 and the second heat dissipation unit 0200. The function of the connection portion 0300 is at least to implement an integrated fixing of the first heat dissipation unit 0100 and the second heat dissipation unit 0200. The connection portion 0300 is thermally separated from the first heat dissipation unit 0100, thereby directly isolating heat exchange between the second heat dissipation unit 0200 and the second heat dissipation plate 0120 serving as a direct heat dissipation portion of the high-temperature device 2000, and avoiding thermal damage.

Exemplarily, one end of the connection portion 0300 is connected to the first heat dissipation plate 0210, and the other end is connected to the heat dissipation base 0110. Meanwhile, a third insulating air gap 0600 is provided between the connection portion 0300 and the second heat dissipation plate 0120. The function of the third insulating air gap 0600 is at least to isolate thermal conduction between the connection portion 0300 and the second heat dissipation plate 0120. Exemplarily, the composition of the second isolating air gap may be air.

Exemplarily, a multi-point connection (or a small end face connection formed by finite points) is formed between the connection portion 0300 and the first heat dissipation plate 0210, and a multi-point connection is also formed between the connection portion 0300 and the heat dissipation base 0110, so as to compress action areas between the connection portion 0300 and the first heat dissipation plate 0210 and compress action areas between the connection portion 0300 and the heat dissipation base 0110, avoiding possible thermal conduction. For example, the connection portion 0300 is composed of a plurality of elongated connecting strips, such that connection strength is guaranteed and a contact area is reduced, ensuring an internal temperature gradient of the integrated radiator 1000 to be kept constant.

Exemplarily, the connection portion 0300 is made of a thermal insulation material (such as thermal insulation plastic), completely isolating the thermal conduction between the first heat dissipation unit 0100 and the second heat dissipation unit 0200. Exemplarily, the heat dissipation base 0110, the second heat dissipation plate 0120, the first heat dissipation plate 0210, and the auxiliary heat dissipation channel 0220 may be integrally formed with the connection portion 0300. In another example, the first heat dissipation unit 0100 and the second heat dissipation unit 0200 and the connection portion 0300 may be fixed by assembly.

In all examples shown and described herein, any particular value should be interpreted as exemplary only and not as a limitation, and thus other examples of exemplary embodiments may have different values.

It is to be noted that similar reference numerals and letters indicate similar items in the subsequent drawings, and therefore, once a particular item is defined in a drawing, the item needs no more definition and explanation in subsequent drawings.

The above embodiments are merely several embodiments of the present application, and the specific and detailed description thereof cannot be understood as a limit to the scope of the present application. It is to be noted that for those skilled in the art, a number of improvements and modifications can be made without departing from the concept of the present application, and these improvements and modifications are within the scope of the present application. Therefore, the scope of the present application is defined by the appended claims.

What is claimed is:

1. An integrated radiator having a temperature gradient disposed between a high-temperature device and a low-temperature device, comprising:
    a first heat dissipation unit and a second heat dissipation unit which are integrally fixed,
    wherein the first heat dissipation unit is configured to maintain the high-temperature device within a first temperature range, the second heat dissipation unit is configured to maintain the low-temperature device within a second temperature range,
    a thermal conductive path of the first heat dissipation unit is isolated from a thermal conductive path of the second heat dissipation unit, and
    the first heat dissipation unit is physically connected to but thermally separated from the second heat dissipation unit;
    wherein the second heat dissipation unit comprises a first heat dissipation plate, a side surface of the first heat dissipation plate facing away from the high-temperature device is kept in contact with the low-temperature device, and a side surface of the first heat dissipation plate facing towards the high-temperature device is provided with an auxiliary heat dissipation channel, and the auxiliary heat dissipation channel is thermally separated from the first heat dissipation unit.

2. The integrated radiator having the temperature gradient of claim 1, wherein the first heat dissipation unit comprises a heat dissipation base and a second heat dissipation plate which are integrally connected, a side surface of the second heat dissipation plate facing away from the low-temperature device is kept in contact with the high-temperature device, and a temperature gradient of the first heat dissipation unit points to the second heat dissipation plate from the heat dissipation base.

3. The integrated radiator having the temperature gradient of claim 2, wherein the second heat dissipation plate is kept separated from the second heat dissipation unit, and the heat dissipation base is disposed at a side of the second heat dissipation plate facing away from the second heat dissipation unit.

4. The integrated radiator having the temperature gradient of claim 2, wherein an insulating air gap is provided between the second heat dissipation plate and the second heat dissipation unit.

5. The integrated radiator having the temperature gradient of claim 2, wherein a connection portion is provided between the first heat dissipation unit and the second heat dissipation unit, and the connection portion is thermally separated from the f second heat dissipation plate through an insulating air gap.

6. The integrated radiator having the temperature gradient of claim 1, wherein the auxiliary heat dissipation channel comprises a plurality of heat dissipation fins, the plurality of heat dissipation fins is disposed on the side surface of the first heat dissipation plate facing towards the high-temperature device, a heat dissipation flow channel is formed between adjacent ones of the plurality of heat dissipation fins, and a flow direction of cooling fluid in the heat dissipation flow channel is perpendicular to a temperature gradient of the first heat dissipation unit.

7. The integrated radiator having the temperature gradient of claim 6, wherein a plurality of heat dissipation flow channels is parallel to each other, and one end of the auxiliary heat dissipation channel is provided with a heat dissipation fan.

8. The integrated radiator having the temperature gradient of claim 6, wherein a height of each of the plurality of heat dissipation fins is positively correlated with heat value of the low-temperature device acted upon the plurality of heat dissipation fins.

9. The integrated radiator having the temperature gradient of claim 1, wherein an insulating air gap is provided between the auxiliary heat dissipation channel and the first heat dissipation unit.

10. The integrated radiator having the temperature gradient of claim 5, wherein one end of the connection portion is connected to a second heat dissipation unit, and another end of the connection portion is connected to the heat dissipation base.

11. The integrated radiator having the temperature gradient of claim 10, wherein a multi-point connection is formed between the connection portion and the heat dissipation base, so as to compress action areas between the connection portion and the heat dissipation base.

12. The integrated radiator having the temperature gradient of claim 11, wherein the connection portion comprises a plurality of elongated connecting strips.

13. The integrated radiator having the temperature gradient of claim 5, wherein the connection portion is made of a thermal insulation material, and the thermal insulation material is thermal insulation plastic.

14. The integrated radiator having the temperature gradient of claim 2, wherein the second heat dissipation plate is a metal sheet, and the metal sheet is a copper sheet or an aluminum sheet.

15. The integrated radiator having the temperature gradient of claim 6, wherein the heat dissipation flow channel forms a flow channel structure surrounded on three sides and opened on one side.

16. The integrated radiator having the temperature gradient of claim 6, wherein the heat dissipation flow channel has an inverted T-shaped structure, a bottom edge of the inverted T-shaped structure is kept connected to the first heat dissipation plate, and an extension direction of the bottom edge of the inverted T-shaped structure is consistent with a flow direction of the cooling fluid of the heat dissipation flow channel.

17. The integrated radiator having the temperature gradient of claim 6, wherein along an extension direction of the heat dissipation flow channel, the heat dissipation flow channel presents an undulating shape and has different heat dissipation action areas at different action parts.

18. An integrated radiator having a temperature gradient disposed between a high-temperature device and a low-temperature device, comprising:
   a first heat dissipation unit and a second heat dissipation unit which are integrally fixed, wherein the first heat dissipation unit is configured to maintain the high-temperature device within a first temperature range, the second heat dissipation unit is configured to maintain the low-temperature device within a second temperature range, a thermal conductive path of the first heat dissipation unit is isolated from a thermal conductive path of the second heat dissipation unit, and the first heat dissipation unit is physically connected to but thermally separated from the second heat dissipation unit;
   wherein the first heat dissipation unit comprises a heat dissipation base and a heat dissipation plate which are integrally connected, a side surface of the heat dissipation plate facing away from the low-temperature device is kept in contact with the high-temperature device, and a temperature gradient of the first heat dissipation unit points to the heat dissipation plate from the heat dissipation base;
   wherein a connection portion is provided between the first heat dissipation unit and the second heat dissipation unit, and the connection portion is thermally separated from the heat dissipation plate through an insulating air gap;
   wherein one end of the connection portion is connected to the second heat dissipation unit, and another end of the connection portion is connected to the heat dissipation base.

19. The integrated radiator having the temperature gradient of claim 18, wherein a multi-point connection is formed between the connection portion and the heat dissipation base, so as to compress action areas between the connection portion and the heat dissipation base.

20. The integrated radiator having the temperature gradient of claim 19, wherein the connection portion comprises a plurality of elongated connecting strips.

* * * * *